United States Patent
Aigner et al.

(10) Patent No.: US 6,389,902 B2
(45) Date of Patent: May 21, 2002

(54) MICROMECHANICAL SENSOR AND METHOD FOR ITS PRODUCTION

(75) Inventors: Robert Aigner, München; Hans-Jörg Timme, Ottobrunn; Thomas Bever, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/781,798

(22) Filed: Feb. 12, 2001

Related U.S. Application Data

(63) Continuation of application No. PCT/DE99/02375, filed on Aug. 3, 1999.

(30) Foreign Application Priority Data

Aug. 11, 1998 (DE) .......................................... 198 36 342

(51) Int. Cl.⁷ .............................. G01L 9/00; G01L 9/16
(52) U.S. Cl. ....................................................... 73/754
(58) Field of Search ......................... 73/754, 775, 755, 73/718, 724, 517 R; 361/283.1, 283.2, 283.3, 283.4; 29/25, 42

(56) References Cited

U.S. PATENT DOCUMENTS

| | | | |
|---|---|---|---|
| 5,110,373 A | 5/1992 | Mauger | 148/33.2 |
| 5,146,435 A | 9/1992 | Bernstein | 29/25.42 |
| 5,216,490 A | 6/1993 | Greiff et al. | 73/517 R |
| 5,259,247 A | 11/1993 | Bantien | 73/718 |
| 5,725,785 A | 3/1998 | Ishida et al. | 437/228 |

FOREIGN PATENT DOCUMENTS

| | | |
|---|---|---|
| DE | 41 903 C1 | 3/1996 |
| DE | 196 48 424 C1 | 6/1998 |
| JP | 63 056 962 | 3/1988 |
| JP | 63 084 072 | 4/1988 |

OTHER PUBLICATIONS

Kevin C. Lee: "The Fabrication of Thin, Freestanding, Single–Crystal, Semiconductor Membranes", J. Electrochem. Soc., vol. 137, No. 8, Aug. 1990, pp. 2556–2574.
Masayoshi Esashi et al.: "Fabrication of Catheter–Tip and Sidewall Miniature Pressure Sensors", IEEE Transactions on Electron Devices, vol. ED–29, No. 1, Jan. 1982, pp. 57–63.
Anton Heuberger (ed.): "Mikromechanik" [micro–mechanics], Springer Verlag Berlin, 1989, pp. 162–171 (No month).

*Primary Examiner*—William Oen
(74) *Attorney, Agent, or Firm*—Herbert L. Lerner; Laurence A. Greenberg; Werner H. Stemer

(57) ABSTRACT

The invention relates to a micromechanical sensor and to a corresponding production method that includes the following steps: a) preparing a doped semiconductor wafer; b) applying an epitaxial layer that is doped in such a way that a jump in the charge carrier density in the interface between the semiconductor wafer and the epitaxial layer occurs; c) optionally etching ventilation holes traversing the epitaxial layer and optionally filling the ventilation holes with a sacrificial material; d) depositing at least one sacrificial layer, at least one spacing layer, a membrane and optionally a semiconductor circuit on the top side of the epitaxial layer using a technology known per se, wherein the semiconductor circuit may be applied after the membrane is formed or while depositing the layers required to form the membrane; e) etching a hole on the back part of the sensor, wherein the etching method is selected in such a way that etching advances in the direction of the top side and ceases in the interference between the wafer and the epitaxial layer by changing charge carrier concentration. The invention also relates to the utilization of the micromechanical sensor in pressure sensors or microphones.

13 Claims, 1 Drawing Sheet

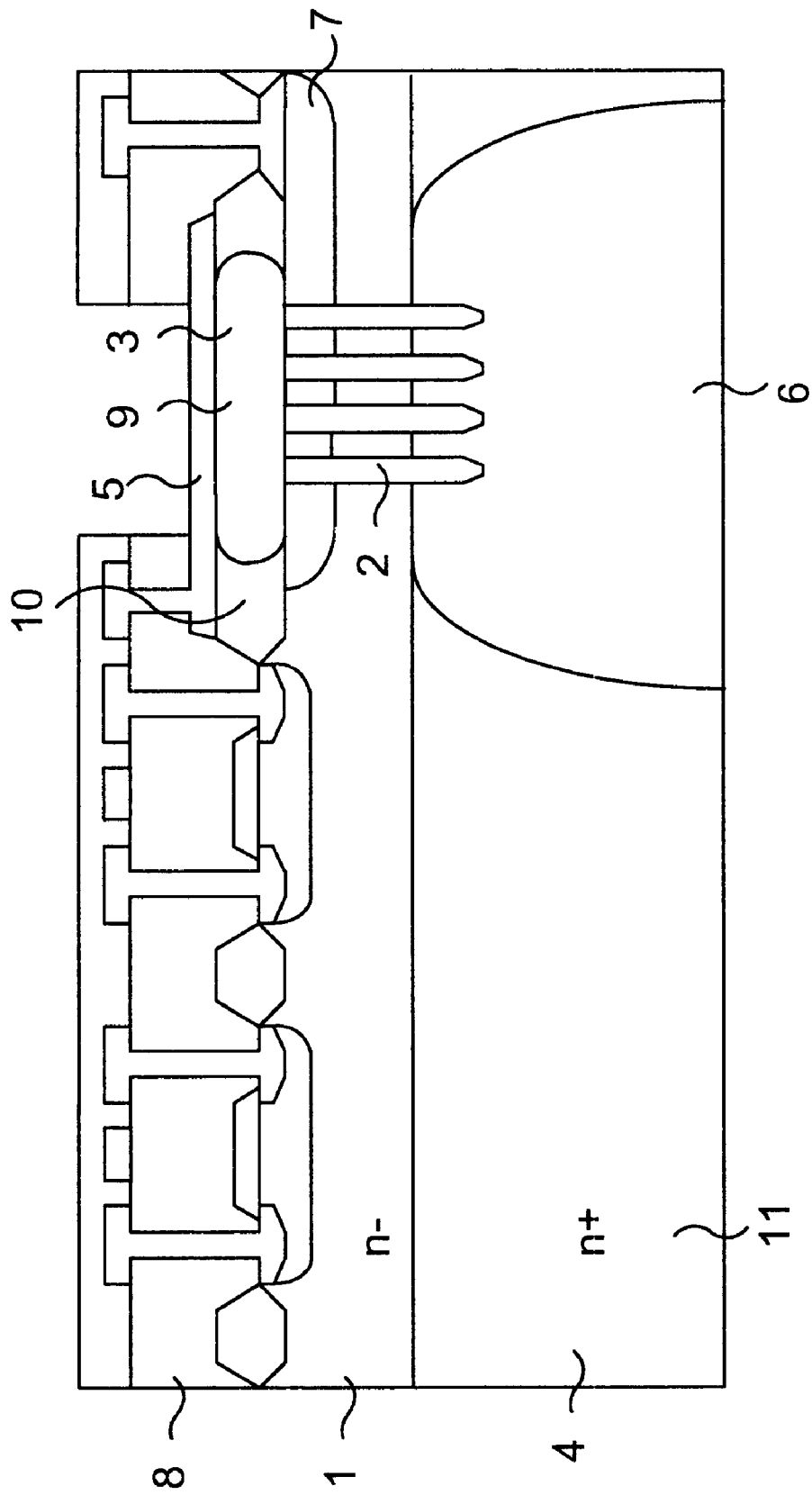

MICROMECHANICAL SENSOR AND METHOD FOR ITS PRODUCTION

CROSS-REFERENCE TO RELATED APPLICATION

This application is a continuation of copending International Application No. PCT/DE99/02375, filed Aug. 3, 1999, which designated the United States.

BACKGROUND OF THE INVENTION

Field of the Invention

The invention relates to a micromechanical sensor including a substrate, an epitaxially grown layer projecting over the entire substrate surface, a membrane, a counterelectrode, a rear opening, and a cavity which is arranged between the membrane and the counterelectrode. In addition, a method of producing the above-described micromechanical sensor is described.

Micromechanical sensors are described in a series of documents. For example, U.S. Pat. No. 5,110,373 describes a method of producing a silicon membrane, which is used in micromechanical sensors. JP 63084072 shows a pressure sensor and a method for its production.

In applications which involve low costs and the smallest possible space requirement, such as pressure sensors, microphones or acceleration sensors, miniaturized micromechanical sensors with semiconductor circuit elements integrated on the chip are needed.

A micromechanical sensor for applications in acoustics is described in U.S. Pat. No. 5,146,435. The sensor specified includes a movable membrane and a supporting structure made of a silicon substrate. Arranged above the substrate is a silicon counterelectrode, which forms a cavity between the membrane and the counterelectrode. The counterelectrode and the membrane are designed to be conductive by suitable doping of the silicon, which produces a capacitor structure. If the membrane is excited to vibrate, the capacitance of the capacitor changes. The capacitance is determined with the aid of metal contacts arranged on the top of the structure. An embodiment with an integrated drive and evaluation electronics unit is not specified.

In the sensor structure specified, the counterelectrode projects beyond the substrate surface. The counterelectrode is on the top of the sensor. For the purposes of connecting the cavity to the surroundings, ventilation openings are incorporated in the counterelectrode. Underneath the membrane, the wafer is provided with an opening, which likewise produces connection between the membrane surface and the surroundings. Sound vibrations can get directly to the membrane through the opening on the underside and excite the membrane to vibrate.

German patent application 196 48 424.3 describes a micromechanical sensor having an integrated circuit, which can be used in pressure and sound measurements. The sensor has a membrane surface arranged in the direction of the top. Underneath the membrane there is a cavity. The counterelectrode is arranged in the area of the substrate. The counterelectrode has ventilation openings in order to reduce the resonant frequency of the membrane. The ventilation openings are arranged in the direction of the underside of the sensor and connect the volume of the cavity to the underside of the sensor. During the production of the micromechanical sensor described, the starting point is an SOI wafer (silicon oxide isolator). An SOI wafer includes the following layers: monocrystalline silicon/silicon dioxide/monocrystalline silicon. After the sensor structure on the top of the SOI wafer has been finished, a cavity is produced on the underside of the chip in an additional etching step. The cavity exposes the counterelectrode with the ventilation openings. The etching of these openings on the underside is carried out selectively with respect to silicon oxide, using KOH or TMAH.

With respect to these etchants, the silicon oxide layer of the SOI substrate constitutes an etch stop.

It has now been found that, during the production of micromechanical sensors, the use of KOH for etching the rear entails disadvantages. It has been shown that, during the etching process, KOH can attack structures already located on the surface of the sensor, for example layers of aluminum on the top of the micromechanical sensor. If micromechanical sensors are produced with membranes which have additional openings, the result is particular problems. These additional openings in the membrane are produced either for simple production of the cavity or in order to reduce the resonant frequency. During the etching of the rear openings, it is possible during the fabrication sequence for complete destruction of subareas of the membrane to occur, and therefore for contact to occur between the acid and the top of the micromechanical sensor.

SUMMARY OF THE INVENTION

It is accordingly an object of the invention to provide a micromechanical sensor and a method for producing the micromechanical sensor which overcomes the above-mentioned disadvantageous of the prior art apparatus and methods of this general type. In particular, by avoiding these disadvantages, the economy of the production method is to be increased.

With the foregoing and other objects in view there is provided, in accordance with the invention a method of producing a micromechanical sensor, that includes steps of: providing a doped semiconductor wafer; applying an epitaxial layer on the wafer and ensuring that at least a portion of a region of the epitaxial layer that faces the wafer is doped such that a jump in a charge carrier density occurs at an interface between the wafer and the epitaxial layer; etching ventilation openings through the epitaxial layer; applying at least one sacrificial layer, at least one spacer layer, and a membrane on the epitaxial layer; etching an opening in a rear of the wafer using an etching method such that the etching progresses towards a top of the wafer and stops at an interface between the wafer and the epitaxial layer by a changed charge carrier concentration; and removing the at least one sacrificial layer with an etchant to expose the ventilation openings and to form a membrane, a counterelectrode disposed underneath the membrane, and a cavity disposed between the membrane and the counterelectrode, the ventilation openings connecting the cavity to the opening in the rear of the wafer.

The etching mode used for producing the rear openings is one which is stopped by a change in the charge carrier concentration in the material to be etched during the etching process.

In accordance with an added mode of the invention, an electrochemical etching process is used to perform the step of etching the opening in the rear of the wafer.

In accordance with an additional mode of the invention, 3. the step of etching the opening in the rear of the wafer is performed in two steps: first, a step of wet chemically etching is performed for a defined time period until the etching is close to the interface between the wafer and epitaxial layer; and second, a step of electrochemically etching is performed. The electrochemically etching is stopped by the changed charge carrier concentration between the wafer and the epitaxial layer.

In accordance with another mode of the invention, the ventilation openings are filled with a sacrificial material.

In accordance with a further mode of the invention, a semiconductor circuit is applied on the epitaxial layer after formation of the membrane.

In accordance with a further added mode of the invention, a semiconductor circuit is applied on the epitaxial layer during application of layers needed to form the membrane.

With the foregoing and other objects in view there is provided, in accordance with the invention a micromechanical sensor, that includes: a substrate having a surface and formed from a doped semiconductor material; an epitaxially grown layer projecting over the entire surface of the substrate; a membrane configured on top of the epitaxial layer and made predominantly from a material selected from the group consisting of polycrystalline silicon and monocrystalline silicon; a counterelectrode disposed underneath the membrane; a rear opening formed in the substrate; and a cavity formed between the membrane and the counterelectrode; The epitaxial layer has an area, that faces the substrate, with at least a portion thereof that is doped such that a jump in a charge carrier concentration occurs at an interface between the substrate and the epitaxial layer.

In accordance with an added feature of the invention, the substrate is made from silicon with a charge carrier concentration of more than $10^{18}$ cm$^{-3}$.

In accordance with another feature of the invention, the portion of the area of the epitaxial layer that faces the substrate has a charge carrier concentration of less than $5 \times 10^{14}$ cm$^{-3}$.

In accordance with an additional feature of the invention, the epitaxial layer has a top with the semiconductor circuit applied thereto.

In accordance with a further feature of the invention, the counterelectrode is formed with ventilation openings connecting the cavity with the rear opening.

In accordance with a concomitant feature of the invention, the counterelectrode is formed by a region which is arranged in the epitaxial layer and made electrically conductive by doping. This region is expediently located directly underneath the membrane.

Other features which are considered as characteristic for the invention are set forth in the appended claims.

Although the invention is illustrated and described herein as embodied in a micromechanical sensor and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

FIG. 1 shows a preferred embodiment of an inventive micromechanical sensor.

DESCRIPTION OF THE PREFERRED EMBODIMENTS

Referring now to the sole drawing FIGURE, FIG. 1, there is shown a micromechanical sensor 12. The method of the invention will be explained using the micromechanical sensor 12 in FIG. 1. On a highly doped substrate or wafer 4 having a doping concentration of preferably more than $1 \times 10^{18}$ cm$^{-3}$, an epitaxial layer 1 is deposited with a thickness of 5–10 μm and a doping concentration preferably in the region of $5 \times 10^{14}$ cm$^{-3}$. Then, in three steps, openings are etched into the wafer 4. In the first step, wet chemical etching is carried out at a high etching rate, for example using HF/HNO3, and, in the second step, electrochemical etching with an etch stop on $n^{31}$ silicon (epitaxial layer). As is shown, protection of the aluminum metallization on the top of the sensor is possible by using conventional photoresist and film. During the production of the sensor, the following steps are carried out: Following the application of the epitaxial layer 1, trenches 2 are etched into the epitaxial layer from the top, reaching into the layer of the substrate 4. The trenches are then filled with silicon oxide in a manner known per se. A sacrificial layer 9 can be deposited on the epitaxial layer 1. Then, a semiconductor circuit is applied to the top in a known manner in accordance with a CMOS or BiCMOS process. At the same time, the doped region 7 and auxiliary layers needed for the production of the spacer layer 10 are also applied. On the top of the auxiliary layer, a silicon layer, which may be polycrystalline or monocrystalline, is then applied. The thickness of the silicon layer is preferably less than or equal to 1 μm. The silicon for the membrane layer 5 can preferably be deposited in one process step together with the gate electrodes, which are provided for MOSFETs. The electronic components in the bulk silicon layer are produced in the conventional way (VLSI process or CMOS process). A method for producing these structures on the epitaxial layer 1 is described, for example, in German patent application 196 484 24.3.

After the completion of the top of the chip, the underside is worked. Firstly, in order to produce the rear opening 6, wet chemical etching is carried out, for example with HF/HNO$_3$ or else KOH or TMAH, which has the advantage of a high etching speed. This etching process is stopped by means of time measurement. In the second step, the etching process for the rear opening 6 is continued with electrochemical etching. During this etching process, the etching of the rear is stopped at the transition from the highly doped substrate 4 to the low-doped epitaxial layer 1. The electrochemical etching is carried out by means of HF electrolyte or KOH electrolyte.

In order to complete the sensor, etching selectively with respect to silicon is carried out from the rear, for example by means of hydrofluoric acid. This forms the cavity 3 and the ventilation openings 2.

We claim:

1. A method of producing a micromechanical sensor, which comprises:

providing a doped semiconductor wafer;

applying an epitaxial layer on the wafer and ensuring that at least a portion of a region of the epitaxial layer that faces the wafer is doped such that a jump in a charge carrier density occurs at an interface between the wafer and the epitaxial layer;

etching ventilation openings through the epitaxial layer;

applying at least one sacrificial layer, at least one spacer layer, and a membrane on the epitaxial layer;

etching an opening in a rear of the wafer using an etching method such that the etching progresses towards a top of the wafer and stops at an interface between the wafer and the epitaxial layer by a changed charge carrier concentration; and removing the at least one sacrificial layer with an etchant to expose the ventilation openings and to form a membrane, a counterelectrode disposed underneath the membrane, and a cavity disposed between the membrane and the counterelectrode, the ventilation openings connecting the cavity to the opening in the rear of the wafer.

2. The method according to claim 1, which comprises using an electrochemical etching process to perform the step of etching the opening in the rear of the wafer.

3. The method according to claim 2, which comprises performing the step of etching the opening in the rear of the wafer in two steps:

first, performing a step of wet chemically etching for a defined time period until the etching is close to the interface between the wafer and epitaxial layer; and second, performing a step of electrochemically etching, the electrochemically etching being stopped by the changed charge carrier concentration between the wafer and the epitaxial layer.

4. The method according to claim 1, which comprises performing the step of etching the opening in the rear of the wafer in two steps:

first, performing a step of wet chemically etching for a defined time period until the etching is close to the interface between the wafer and epitaxial layer; and second, performing a step of electrochemically etching, the electrochemically etching being stopped by the changed charge carrier concentration between the wafer and the epitaxial layer.

5. The method according to claim 1, which comprises filling the ventilation openings with a sacrificial material.

6. The method according to claim 1, which comprises applying a semiconductor circuit on the epitaxial layer after formation of the membrane.

7. The method according to claim 1, which comprises applying a semiconductor circuit on the epitaxial layer during application of layers needed to form the membrane.

8. A micromechanical sensor, comprising:

a substrate having a surface and formed from a doped semiconductor material;

an epitaxially grown layer projecting over the entire surface of said substrate;

a membrane configured on top of said epitaxial layer and made predominantly from a material selected from the group consisting of polycrystalline silicon and monocrystalline silicon;

a counterelectrode disposed underneath said membrane;

a rear opening formed in said substrate; and a cavity formed between said membrane and said counterelectrode;

said epitaxial layer having an area that faces said substrate with at least a portion thereof that is doped such that a jump in a charge carrier concentration occurs at an interface between the substrate and the epitaxial layer.

9. The micromechanical sensor according to claim 8, wherein said substrate is made from silicon with a charge carrier concentration of more than $10^{18}$ cm$^{-3}$.

10. The micromechanical sensor according to claim 8, wherein said portion of said area of said epitaxial layer that faces said substrate has a charge carrier concentration of less than $5 \times 10^{14}$ cm$^{-3}$.

11. The micromechanical sensor according to claim 8, comprising a semiconductor circuit, said epitaxial layer having a top with said semiconductor circuit applied thereto.

12. The micromechanical sensor according to claim 8, wherein said counterelectrode is formed with ventilation openings connecting said cavity with said rear opening.

13. Use of the micromechanical sensor according to claim 8 for pressure sensors or microphones.

* * * * *